United States Patent
Arai (10) Patent No.: US 10,291,235 B2
(45) Date of Patent: May 14, 2019

(54) OVEN CONTROLLED CRYSTAL OSCILLATOR

(71) Applicant: NIHON DEMPA KOGYO CO., LTD., Tokyo (JP)

(72) Inventor: Junichi Arai, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 200 days.

(21) Appl. No.: 15/439,955

(22) Filed: Feb. 23, 2017

(65) Prior Publication Data

US 2017/0250691 A1 Aug. 31, 2017

(30) Foreign Application Priority Data

Feb. 29, 2016 (JP) ................. 2016-037837

(51) Int. Cl.
| | |
|---|---|
| *H03B 5/36* | (2006.01) |
| *H03L 1/02* | (2006.01) |
| *H03L 1/04* | (2006.01) |
| *G05D 23/24* | (2006.01) |

(52) U.S. Cl.
CPC ............ *H03L 1/025* (2013.01); *G05D 23/24* (2013.01); *H03B 5/362* (2013.01); *H03L 1/02* (2013.01); *H03L 1/028* (2013.01); *H03L 1/04* (2013.01); *H03B 2200/004* (2013.01); *H03B 2200/0018* (2013.01)

(58) Field of Classification Search
CPC ........... H03L 1/028; H03L 1/04; H03L 1/023; H03B 5/04; H03B 5/36; H03B 2200/004; G05D 23/24
See application file for complete search history.

(56) References Cited

U.S. PATENT DOCUMENTS

| | | | | |
|---|---|---|---|---|
| 2011/0199161 | A1* | 8/2011 | Matsumoto | H03B 5/368 331/158 |
| 2012/0146738 | A1* | 6/2012 | Matsumoto | H03L 1/028 331/158 |
| 2012/0292300 | A1* | 11/2012 | Arai | H05B 1/0263 219/210 |

FOREIGN PATENT DOCUMENTS

| | | | |
|---|---|---|---|
| CN | 202798581 U | * | 3/2013 |
| JP | H05218741 | | 8/1993 |
| JP | 2000031741 | | 1/2000 |
| JP | 2012138890 | | 7/2012 |

* cited by examiner

Primary Examiner — Ryan Johnson
(74) Attorney, Agent, or Firm — JCIPRNET (57) ABSTRACT

An oven controlled crystal oscillator includes a crystal oscillator, a temperature control circuit, and a control integrated circuit. The crystal oscillator includes a crystal resonator and an oscillator circuit. The temperature control circuit includes a heater resistor, a thermistor, a first resistor, a second resistor, a third resistor, a differential amplifier, a thermosensor, and a fourth resistor. The thermosensor is disposed in parallel to the first resistor. The thermosensor has one end to which the supply voltage is supplied. The fourth resistor has one end connected to another end of the thermosensor and another end that is grounded. The control integrated circuit includes a digital variable resistor and a controller. The digital variable resistor is connected to the thermosensor in parallel. The controller adjusts a resistance value of the digital variable resistor based on a digital control signal input from outside.

6 Claims, 3 Drawing Sheets

OVEN CONTROLLED CRYSTAL OSCILLATOR

CROSS REFERENCE TO RELATED APPLICATIONS

This application is based on and claims priority under 35 U.S.C. § 119 to Japanese Patent Application No. 2016-037837, filed on Feb. 29, 2016, the entire content of which is incorporated herein by reference.

TECHNICAL FIELD

This disclosure relates to an oven controlled crystal oscillator, especially, relates to an oven controlled crystal oscillator configured to easily perform a frequency adjustment with a high accuracy without deteriorating a phase noise characteristic.

DESCRIPTION OF THE RELATED ART

An oven controlled crystal oscillator (Oven Controlled Crystal Oscillator; OCXO) has a configuration that houses a crystal controlled oscillator in an oven to maintain at a constant temperature, and is a device with a high frequency stability among the crystal controlled oscillators.

The oven includes a temperature sensor and a heat source to perform a temperature control, thus maintaining the inside at the constant temperature.

The OCXO uses a crystal resonator, which is representatively an SC-cut or an AT-cut, designed for the OCXO. The AT-cut crystal unit has frequency/temperature characteristics indicated as a cubic function curve so as to be performed with the temperature control in a proximity of an apex of the curve as a multiple root by the oven.

However, the turnover temperature varies due to the variation of a cutting process of the crystal, and when an extremely high stability of an order of Parts Per Billion (ppb; $10^{-9}$) such as the OCXO is required, an influence of the variation in the process cannot be ignored.

Therefore, in the oven controlled crystal oscillator, the turnover temperature is individually measured by each crystal unit to adjust a circuit constant of a temperature control circuit, thus setting the oven to the turnover temperature.

While a frequency adjustment accuracy of a common crystal oscillator is adjusted to approximately ±0.1 ppm (Parts Per Million; $10^{-6}$), the OCXO has a higher stability and a higher accuracy, so as to require an individual manual adjustment of the oscillator and the temperature control circuit, thus many adjustment items are prepared to make the adjustment complicated.

The adjustment items include a sensitivity (VC sensitivity) that electrically varies the frequency, an oven setting temperature, an oscillation frequency, an oven correction circuit, an output adjustment circuit, a temperature correction circuit, and similar item.

Further, as a related art configured to easily vary the frequency, there is provided an oscillator that uses a Phase Locked Loop (PLL) circuit and a Direct Digital Synthesizer (DDS) circuit.

However, the oscillator that uses the PLL circuit and the DDS circuit generates a noise specific to a digital circuit, so as to cause deteriorations of the characteristics such as a deterioration of the phase noise, a deterioration of jitter, and an unnecessary occurrence of a spurious.

RELATED TECHNIQUE

Conventional techniques relating to the frequency adjustment of the oscillator have been disclosed in Japanese Unexamined Patent Application Publication No. 2012-138890 "PIEZOELECTRIC OSCILLATOR" (NIHON DEMPA KOGYO CO., LTD., hereinafter referred to as Patent Literature 1), Japanese Unexamined Patent Application Publication No. 2000-31741 "OSCILLATED FREQUENCY CONTROL METHOD, VOLTAGE CONTROLLED PIEZOELECTRIC OSCILLATOR, VOLTAGE CONTROLLED PIEZOELECTRIC OSCILLATOR ADJUSTMENT SYSTEM AND METHOD FOR ADJUSTING VOLTAGE CONTROLLED PIEZOELECTRIC OSCILLATOR" (Seiko Epson Corp., hereinafter referred to as Patent Literature 2), and Japanese Unexamined Patent Application Publication No. 5-218741 "METHOD FOR CORRECTING OSCILLATION FREQUENCY FROM CRYSTAL OSCILLATOR" (CITIZEN WATCH CO., LTD., hereinafter referred to as Patent Literature 3).

Patent Literature 1 discloses a piezoelectric oscillator where a cathode of a variable capacitance diode is connected to an input side of an oscillator circuit, further, the cathode is connected to a control voltage electrode of a potentiometer via a resistor, and the potentiometer is configured to be applied with a supply voltage via a regulator, thus applying a constant voltage to the cathode of the diode regardless of the variation of the supply voltage to reduce the frequency variation.

Patent Literature 2 discloses a piezoelectric oscillator that includes a variable voltage generating circuit to supply an oscillator circuit with a supply voltage, which is adjusted corresponding to a control voltage, so as to make an oscillation frequency variable.

Patent Literature 3 discloses a crystal oscillator where a frequency measuring instrument measures an oscillation signal, the measured signal is operated by computing equipment, and frequency deviation data is stored in a memory circuit, so as to correct an oscillation frequency.

However, since the conventional oven controlled crystal oscillator requires manual adjustments of the temperature control circuit and the oscillator by individual products, the works are complicated. The oscillator that employs the PLL circuit has a problem where the phase noise is deteriorated while the frequency adjustment is easily performed.

In Patent Literatures 1 to 3, there is no description of the configuration where a digital control IC is disposed to adjust the operation of the temperature control circuit.

A need thus exists for an oven controlled crystal oscillator which is not susceptible to the drawback mentioned above.

SUMMARY

According to an aspect of this disclosure, there is provided an oven controlled crystal oscillator includes a crystal oscillator, a temperature control circuit, and a control integrated circuit (IC). The crystal oscillator includes a crystal resonator and an oscillator circuit. The temperature control circuit includes a heater resistor, a thermistor, a first resistor, a second resistor, a third resistor, a differential amplifier, a thermosensor, and a fourth resistor. The heater resistor has one end to which a supply voltage connects to generate a heat. The thermistor is configured to output a voltage to one end. The voltage corresponds to a temperature. The first resistor has one end to which the supply voltage is supplied and another end connected to the one end of the thermistor. The second resistor has one end to which the supply voltage is supplied. The third resistor has one end connected to another end of the second resistor and another end of the third resistor is grounded. The differential amplifier has one input terminal and another input terminal. A voltage between the another end of the first resistor and the one end of the thermistor is input to the one input terminal. A voltage between the another end of the second resistor and the one end of the third resistor is input to the another input terminal. The differential amplifier amplifies a difference between the voltage input to the one input terminal and the voltage input to the another input terminal so as to output as a control voltage. The thermosensor is disposed in parallel to the first resistor. The thermosensor has one end to which the supply voltage is supplied. The fourth resistor has one end connected to another end of the thermosensor and another end of the fourth resistor is grounded. The control IC includes a digital variable resistor and a controller. The digital variable resistor is connected to the thermosensor in parallel. The controller adjusts a resistance value of the digital variable resistor based on a digital control signal input from outside.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

A description will be given of embodiments of this disclosure by referring to the drawings.

Outline of Embodiments

An oven controlled crystal oscillator according to the embodiments of this disclosure includes an analog crystal oscillator with a low noise and a temperature control circuit, and additionally includes a digital control IC with a digital potentiometer and a controller. The controller adjusts a resistance value of the digital potentiometer based on a digital control signal input from outside, so as to apply a voltage for compensating for a temperature-dependent characteristic to the temperature control circuit. The oven controlled crystal oscillator is configured to perform a digital control to accurately and easily adjust the temperature control circuit without deteriorating a phase noise characteristic, and configured to stabilize the operation of the temperature control circuit to maintain a turnover temperature of a crystal resonator, thus obtaining an output frequency signal with a high accuracy and a high stability.

The oven controlled crystal oscillator according to the embodiment of this disclosure further includes another potentiometer on the digital control IC. The controller adjusts a resistance value of the other digital potentiometer based on a digital control signal input from outside, so as to apply a voltage for adjusting the output frequency to the analog crystal oscillator. The oven controlled crystal oscillator is configured to perform a digital control to accurately and easily adjust the oscillation frequency, thus obtaining the output frequency signal with the high accuracy and the high stability.

Figure 1:
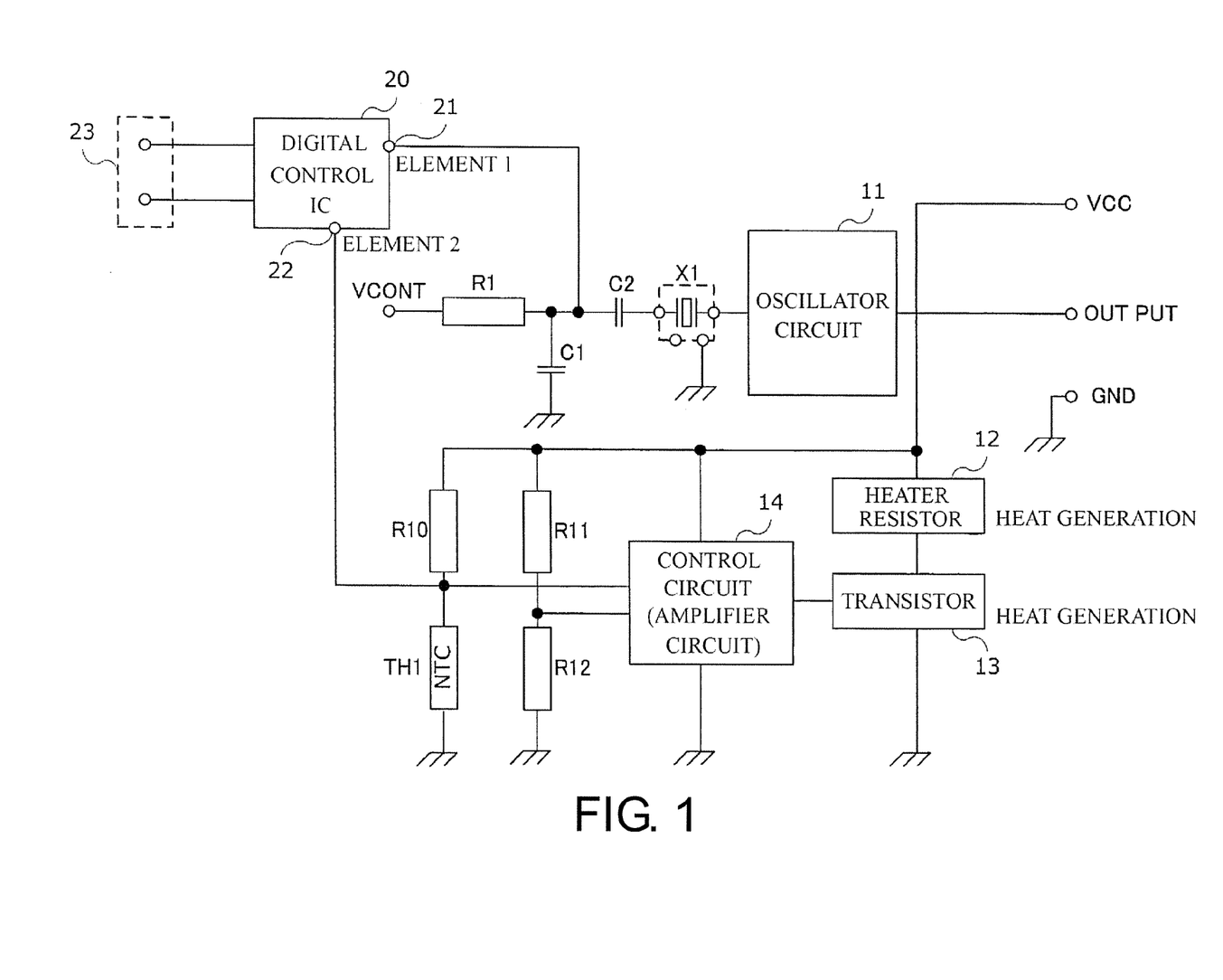
FIG. 1 is a circuit diagram of an oven controlled crystal oscillator according to an embodiment of the disclosure.

[Circuit Configuration of Oven Controlled Crystal Oscillator According to Embodiment: FIG. 1]

A circuit configuration of the oven controlled crystal oscillator according to the embodiment of this disclosure will be described by referring to FIG. 1. FIG. 1 is a circuit diagram illustrating the oven controlled crystal oscillator according to the embodiment of this disclosure.

FIG. 1 indicates a circuit corresponding to a second oven controlled crystal oscillator described later.

As illustrated in FIG. 1, an oven controlled crystal oscillator according to the embodiment of this disclosure (the oven controlled crystal oscillator) includes a crystal oscillator (oscillator unit), constituted of an analog circuit, and a temperature control circuit similarly to a conventional oven controlled crystal oscillator, and characteristically, additionally includes a digital control IC 20 that performs a digital control on the oscillator unit and the temperature control circuit.

The use of the oscillator unit with the analog circuit makes the phase noise characteristic proper.

[Digital Control IC 20]

A description will be given of the digital control IC 20 as a characterizing unit of the oven controlled crystal oscillator.

The digital control IC 20 outputs a control signal for adjusting the operation to the temperature control circuit and the oscillator unit.

Specifically, the digital control IC 20 internally includes the controller and a digital variable resistor (digital potentiometer). The controller adjusts the resistance value of the digital variable resistor based on a digital signal input from outside, so as to output a control signal (control voltage) corresponding to the digital signal.

The configuration of the digital control IC 20 will be described later.

The digital control IC 20 is configured to be connected to two elements as adjustment target elements, and includes an input terminal 23 to which a control signal (external control signal) from outside is input, a connecting terminal 21 (in FIG. 1, indicated as "ELEMENT 1") that outputs a control signal for adjusting the first element, and a connecting terminal 22 (in FIG. 1, indicated as "ELEMENT 2") that outputs a control signal for adjusting the second element.

The control signal output from the connecting terminal 21 is referred to as an first element control signal, and the control signal output from the connecting terminal 22 is referred to as a second element control signal.

Then, the oven controlled crystal oscillator is configured to use the element 1 as the oscillator unit and the element 2 as the temperature control circuit to accurately and easily perform the adjustment of the oscillator unit and the temperature control circuit.

That is, the oven controlled crystal oscillator uses the analog oscillator unit to make the phase noise characteristic proper, and uses the digital control IC 20 to indirectly perform the individual adjustment, which conventionally includes complicated processes, for each product.

In the adjustment, inputting a value of an adjustment parameter (specifically, a resistance value) to each element (temperature control circuit and oscillator unit) from outside varies the resistance value of the digital variable resistor to perform a fine adjustment of the temperature control circuit and the oscillator unit, so as to adjust the property of the temperature control circuit and the output frequency of the oven controlled crystal oscillator to provide a desired output characteristic.

This ensures the fine adjustment to provide a proper characteristic of the output signal compared with the conventional adjustment by the analog element, and ensures the efficiency of the adjustment process to be significantly improved.

[Temperature Control Circuit: FIG. 1]

Next, a description will be given of the temperature control circuit of the oven controlled crystal oscillator.

As illustrated in FIG. 1, the temperature control circuit of the oven controlled crystal oscillator includes a heater resistor 12, a transistor 13, a control circuit 14, and a thermistor TH1 as a main configuration.

The thermistor TH1 is a temperature sensor that outputs a voltage corresponding to a temperature to one end, and the control circuit 14 is a circuit that controls a heat generation corresponding to the output by the thermistor TH1.

The transistor 13 amplifies the signal from the control circuit 14.

The heater resistor 12 and the transistor 13 are heating elements that generate the heat corresponding to the output from the control circuit 14.

A description will be given of a connection in the temperature control circuit.

The heater resistor 12 has one end to which a supply voltage is applied and another end connected to a collector of the transistor 13. An emitter of the transistor 13 is grounded.

The thermistor TH1 has one end to which the voltage corresponding to the temperature is output and another end that is grounded.

To the one end of the thermistor TH1, one end of a resistor R10 is connected, and to the other end of the thermistor TH1, the supply voltage is applied.

A resistor R11 has one end to which the supply voltage is applied and another end connected to one end of a resistor R12. Another end of the resistor R12 is grounded.

The resistors R10, R11, and R12 respectively correspond to a first, a second, and a third resistor described in Claims.

The control circuit (amplifier circuit) 14 is constituted of such as a differential amplifier, and has one input terminal to which a voltage between the thermistor TH1 and the resistor R10 is applied and another input terminal to which a voltage between the resistor R11 and the resistor R12 is applied, so as to amplify the difference between the voltages input to each input terminal to output as the control voltage to the heating element. The control voltage causes the heating element to generate the heat, so as to maintain the temperature in the oven constant.

The output by the control circuit 14 is input to a base of the transistor 13.

Then, as a feature of the oven controlled crystal oscillator, a configuration where the second element control signal from the connecting terminal 22 of the digital control IC 20 is applied between the thermistor TH1 and the resistor R10 is employed.

Specifically, while the temperature inside the oven slightly varies due to the property (temperature inclination) of each element of the temperature control circuit, the digital control IC 20 is configured to output the control signal to compensate for (cancel) the variation.

This ensures the fine adjustment of the operation of the temperature control circuit by the second element control signal from the digital control IC 20, thus accurately maintaining the temperature inside the oven to the turnover temperature of the crystal resonator.

[Oscillator Unit: FIG. 1]

Next, the oscillator unit will be described.

As illustrated in FIG. 1, the oscillator unit of the oven controlled crystal oscillator is basically an analog oscillator similar to the conventional oven controlled crystal oscillator, and includes a crystal resonator X1 that oscillates a specific frequency based on a reference signal and an oscillator circuit 11 that amplifies the output by the crystal resonator X1.

As terminals, the oscillator unit includes a power source terminal VCC to which the power source is applied, an output terminal OUT PUT that outputs the output signal, a ground terminal GND connected to a ground, and a reference signal terminal VCONT to which the reference signal is input.

Then, a resistor R1 and a capacitance element C2 are disposed in series between the reference signal terminal VCONT and the crystal resonator X1, and a capacitance element C1 is disposed so as to have one end connected to a point between the resistor R1 and the capacitance element C2 and another end that is grounded.

The resistor R1, the capacitance element C2, and the capacitance element C1 respectively correspond to a fifth resistor, a first capacitance element, and a second capacitance element, which are described in Claims.

Then, as a feature of the oven controlled crystal oscillator; a configuration where the first element control signal from the connecting terminal 21 of the digital control IC 20 is applied to a point between the capacitance element C1 and the capacitance element C2 is employed.

This ensures the fine adjustment of the oscillation frequency of the oscillator unit to be easily performed by the first element control signal from the digital control IC 20.

Figure 2:
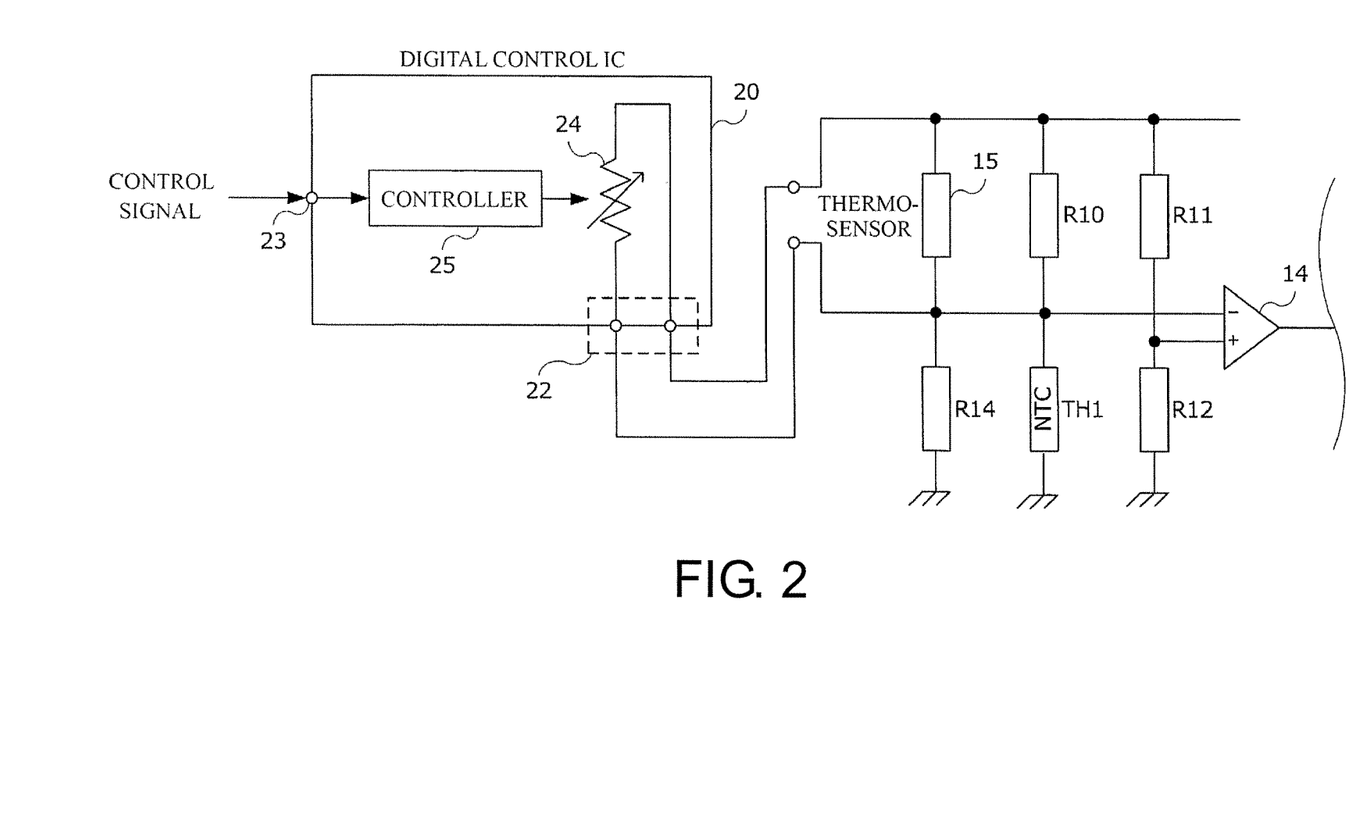
FIG. 2 is an explanatory drawing illustrating a main part of a first oven controlled crystal oscillator.

[Main Part of First Oven Controlled Crystal Oscillator: FIG. 2]

Next, a main part of an oven controlled crystal oscillator (a first oven controlled crystal oscillator) according to a first embodiment of this disclosure will be described by referring to FIG. 2. FIG. 2 is an explanatory drawing illustrating the main part of the first oven controlled crystal oscillator. The configuration other than the main part is identical or corresponding to the configuration indicated in FIG. 1.

The first oven controlled crystal oscillator includes the digital control IC 20 that adjusts the temperature control circuit.

As illustrated in FIG. 2, the digital control IC 20 of the first oven controlled crystal oscillator includes a digital variable resistor 24 and a controller 25.

The digital variable resistor 24 is configured to vary the resistance value in accordance with a command from the controller 25, for example, configured to be controlled in 256 phases.

The controller 25 controls the resistance value of the digital variable resistor 24 based on the external control signal (in FIG. 2, indicated as "CONTROL SIGNAL") from the input terminal 23. As the external control signal, value data corresponding to the resistance values of the 256 phases of the digital variable resistor 24 is input.

The digital variable resistor 24 has both ends connected to respective two connecting terminals 22.

As illustrated in FIG. 2, the first oven controlled crystal oscillator additionally includes a thermosensor 15 and a resistor R14 on the temperature control circuit.

The thermosensor 15 is constituted of such as a thermistor and a linear positive temperature coefficient resistor, and is disposed in parallel to the resistor R10. The thermosensor 15 has one end to which the supply voltage is applied and another end connected to one end of the resistor R14. The resistor R14 has another end that is grounded.

The resistance value of the resistor R14 is configured to be about a few kΩ.

The resistor R14 corresponds to a fourth resistor described in Claims.

Then, the connecting terminal 22 of the digital control IC 20 is connected to both ends of the thermosensor 15 of the temperature control circuit, such that the digital variable resistor 24 is configured to be connected to the thermosensor 15 in parallel.

Varying the resistance value of the digital variable resistor 24 varies a combined resistance value of the thermosensor 15 and the digital variable resistor 24, thus adjusting a sensitivity of the thermosensor 15 to ensure performing the fine adjustment of the temperature control circuit.

While the first oven controlled crystal oscillator requires increasing the number of components of the temperature control circuit, the property of the temperature control circuit can be accurately adjusted, thus ensuring the temperature control with a high stability, so as to improve the stability of the output frequency signal.

Figure 3:
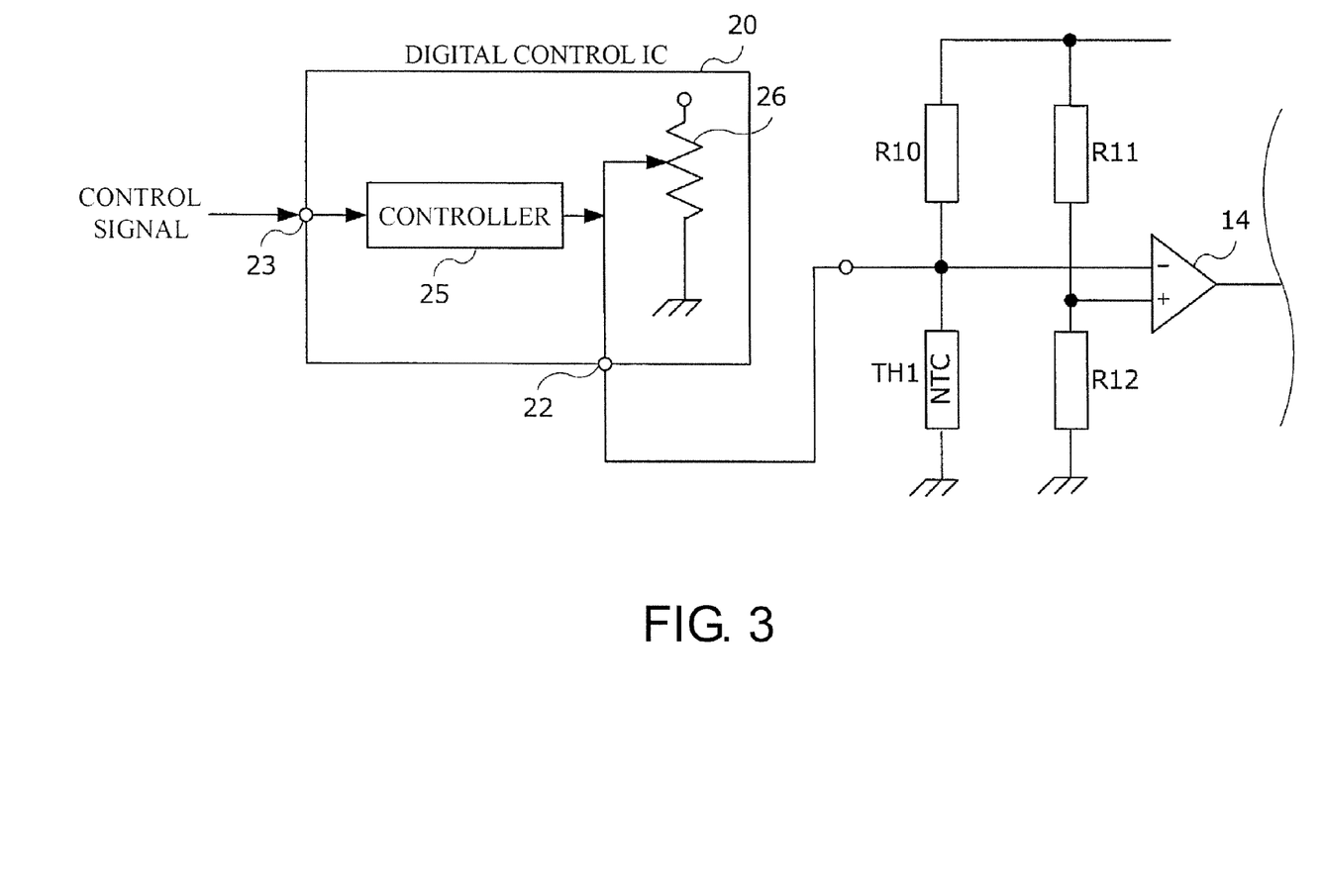
FIG. 3 is an explanatory drawing illustrating a main part of a second oven controlled crystal oscillator.

[Main Part of Second Oven Controlled Crystal Oscillator: FIG. 3]

Next, a main part of an oven controlled crystal oscillator (a second oven controlled crystal oscillator) according to a second embodiment of this disclosure will be described by referring to FIG. 3. FIG. 3 is an explanatory drawing illustrating the main part of the second oven controlled crystal oscillator.

The second oven controlled crystal oscillator also includes the digital control IC 20 that adjusts the temperature control circuit, and as illustrated in FIG. 3, the digital control IC 20 includes a digital variable resistor 26 and the controller 25.

The digital variable resistor 26 is similar to the digital variable resistor 24 indicated in FIG. 2, while the digital variable resistor 26 has one end to which the supply voltage is applied and another end that is grounded.

Then, the controller 25 is configured to adjust the resistance value of the digital variable resistor 26 based on the external control signal from the input terminal 23, so as to output the second element control signal to the connecting terminal 22.

The temperature control circuit of the second oven controlled crystal oscillator has a configuration similar to the temperature control circuit indicated in FIG. 1, such that the second element control signal from the connecting terminal 22 of the digital control IC 20 is input to the point between the resistor R10 and the thermistor TH1.

This ensures adjusting the output signal from the thermistor TH1 to input to the control circuit 14, thus performing the fine adjustment of the operation of the temperature control circuit.

The second oven controlled crystal oscillator ensures easily performing the adjustment of the temperature control circuit with a simple configuration compared with the first oven controlled crystal oscillator.

[Adjustment of Oscillator Unit]

Next, a description will be given of the oven controlled crystal oscillator that performs the adjustment of the oscillator unit in addition to the above-described adjustment of the temperature control circuit.

While the drawings are omitted, a third to a fifth oven controlled crystal oscillators described later perform the adjustment of the oscillator unit together.

[Third Oven Controlled Crystal Oscillator]

First, an oven controlled crystal oscillator (the third oven controlled crystal oscillator) according to a third embodiment of this disclosure will be described.

The third oven controlled crystal oscillator performs the frequency adjustment in the oscillator unit in addition to the above-described adjustment of the temperature control circuit.

The third oven controlled crystal oscillator includes, in addition to the configuration in FIG. 2 or FIG. 3, another digital variable resistor inside the digital control IC 20, and the controller varies the resistance value of the other digital variable resistor based on the control signal from the input terminal 23, thus adjusting the voltage of the first element control signal to output from the connecting terminal 21.

The first element control signal from the connecting terminal 21 is input to a point between the capacitance elements C2 and C1 of the oscillator unit.

This ensures the easy and accurate adjustment of the reference signal to the crystal resonator X1 by inputting the digital data as the external control signal, thus providing a desired frequency signal.

Especially, since the third oven controlled crystal oscillator adjusts both the temperature control circuit and the oscillator unit, the adjustment of the frequency can be accurately performed while the temperature control is stabilized, thus providing the output frequency signal with a much sufficient property.

[Fourth Oven Controlled Crystal Oscillator]

A fourth oven controlled crystal oscillator includes a varicap diode that has a variable resistance outside the digital control IC 20 instead of including the digital variable resistor inside the digital control IC 20, such that the controller adjusts the varicap diode.

Specifically, the varicap diode is disposed between the connecting terminal 21 of the digital control IC 20 and the oscillator unit, and the controller outputs the first element control signal, which can vary the resistance value of the varicap diode, from the connecting terminal 21 based on the external control signal from the input terminal 23. In the fourth oven controlled crystal oscillator, the element 1 is the varicap diode.

This ensures the adjustment of the reference signal of the crystal resonator, so as to easily perform the adjustment of the output frequency.

The fourth oven controlled crystal oscillator ensures stabilizing the temperature control and easily performing the frequency adjustment with an inexpensive configuration similarly to the third oven controlled crystal oscillator.

[Fifth Oven Controlled Crystal Oscillator]

A fifth oven controlled crystal oscillator varies the capacitance to adjust the voltage of the first element control signal, and includes a digital capacitor inside the digital control IC 20.

Then, the controller adjusts a capacitance value of the digital capacitor in accordance with the external control signal from the input terminal 23, so as to output as the first element control signal from the connecting terminal 21, thus adjusting the reference signal of the crystal resonator.

This ensures stabilizing the temperature control and easily performing the adjustment of the oscillation frequency.

Effects of Embodiments

According to an aspect of this disclosure, the oven controlled crystal oscillator includes the oscillator unit constituted of the analog circuit and the temperature control circuit, includes the thermosensor 15 and the resistor R14 connected in series so as to be in parallel to the resistor R10 connected to the thermistor TH1 of the temperature control circuit, and is configured such that the controller 25 of the digital control IC 20 adjusts the resistance value of the digital variable resistor 24, connected in parallel to the thermosensor 15 of the temperature control circuit, based on the external control signal from the input terminal 23, so as to output the second element control signal. The use of the analog oscillator provides the following effects: providing the proper phase noise characteristic, the accurate and easy adjustment of the temperature control circuit by the digital control, stabilizing the operation of the temperature control circuit to maintain the turnover temperature of the crystal resonator, and obtaining the output frequency signal with the high accuracy and the high stability.

According to another aspect of this disclosure, in addition to the above-described configuration, the oven controlled crystal oscillator further includes the other digital variable resistor in the digital control IC 20, and the controller 25 is configured to adjust the resistance value of the other digital variable resistor based on the external control signal input from the input terminal 23 so as to apply the first element control signal for adjusting the reference signal of the oscillator unit. This provides the following effects: stabilizing the temperature control while accurately and easily adjusting the oscillation frequency by the digital control, and obtaining the output frequency signal with the high accuracy and the high stability.

This disclosure is preferable for an oven controlled crystal oscillator that performs the adjustment of an oscillator and a temperature control circuit with ease and high accuracy without deteriorating a phase noise characteristic so as to output a frequency signal with a sufficient property.

According to another aspect of this disclosure, there is provided an oven controlled crystal oscillator that includes a crystal oscillator that includes a crystal resonator and an oscillator circuit, a heater resistor that has one end to which a supply voltage connects to generate a heat, a thermistor configured to output a voltage corresponding to a temperature to one end, a first resistor that has one end to which the supply voltage is supplied and another end connected to the one end of the thermistor, a second resistor that has one end to which the supply voltage is supplied, a third resistor that has one end connected to another end of the second resistor and another end that is grounded, a differential amplifier that has one input terminal to which a voltage between the other end of the first resistor and the one end of the thermistor is input and another input terminal to which a voltage between another end of the second resistor and the one end of the third resistor is input thus amplifying a difference between the voltage input to the one input terminal and the voltage input to the other input terminal so as to output as a control voltage, and a control IC that includes a digital variable resistor connected between the other end of the first resistor and the one end of the thermistor and a controller that adjusts a resistance value of the digital variable resistor based on a digital control signal input from outside.

According to another aspect of this disclosure, in the above-described oven controlled crystal oscillator, the crystal oscillator includes a reference signal terminal that supplies a reference signal to the crystal resonator, a fifth resistor connected in series between the reference signal terminal and the crystal resonator, a first capacitance element connected in series between the fifth resistor and the crystal resonator, and a second capacitance element that has one end connected between the fifth resistor and the first capacitance element and another end that is grounded. The control IC includes another digital variable resistor connected to a point between the first capacitance element and the second capacitance element. The controller adjusts a resistance value of the other digital variable resistor based on a digital control signal input from outside.

According to another aspect of this disclosure, in the above-described oven controlled crystal oscillator, the crystal oscillator includes a reference signal terminal that supplies a reference signal to the crystal resonator, a fifth resistor connected in series between the reference signal terminal and the crystal resonator, a first capacitance element connected in series between the fifth resistor and the crystal resonator, and a second capacitance element that has one end connected between the fifth resistor and the first capacitance element and another end that is grounded. The control IC externally includes a varicap diode connected to a point between the first capacitance element and the second capacitance element. The controller adjusts a resistance value of the varicap diode based on a digital control signal input from outside.

According to another aspect of this disclosure, in the above-described oven controlled crystal oscillator, the crystal oscillator includes a reference signal terminal that supplies a reference signal to the crystal resonator, a fifth resistor connected in series between the reference signal terminal and the crystal resonator, a first capacitance element connected in series between the fifth resistor and the crystal resonator, and a second capacitance element that has one end connected between the fifth resistor and the first capacitance element and another end that is grounded. The control IC includes a digital capacitor connected to a point between the first capacitance element and the second capacitance element. The controller adjusts a capacitance value of the digital capacitor based on a digital control signal input from outside.

According to this disclosure, the oven controlled crystal oscillator includes a crystal oscillator, a temperature control circuit, and a control IC. The crystal oscillator includes a crystal resonator and an oscillator circuit. The temperature control circuit includes a heater resistor that has one end to which a supply voltage connects to generate a heat, a thermistor configured to output a voltage corresponding to a temperature to one end, a first resistor that has one end to which the supply voltage is supplied and another end connected to the one end of the thermistor, a second resistor that has one end to which the supply voltage is supplied, a third resistor that has one end connected to another end of the second resistor and another end that is grounded, a differential amplifier that has one input terminal to which a voltage between the other end of the first resistor and the one end of the thermistor is input and another input terminal to which a voltage between the other end of the second resistor and the one end of the third resistor is input thus amplifying a difference between the voltage input to the one input terminal and the voltage input to the other input terminal so as to output as a control voltage, a thermosensor that is disposed in parallel to the first resistor and has one end to which the supply voltage is supplied, and a fourth resistor that has one end connected to another end of the thermosensor and another end that is grounded. The control IC includes a digital variable resistor connected to the thermosensor in parallel and a controller that adjusts a resistance value of the digital variable resistor based on a digital control signal input from outside. Accordingly, the use of the analog oscillator provides the following effects: providing the proper phase noise characteristic, the accurate and easy adjustment of the temperature control circuit by the digital control, stabilizing the operation of the temperature control circuit to maintain the turnover temperature of the crystal resonator, and obtaining the output frequency signal with the sufficient property and the high stability.

According to the aspect of this disclosure, the oven controlled crystal oscillator includes a crystal oscillator that includes a crystal resonator and an oscillator circuit, a heater resistor that has one end to which a supply voltage connects to generate a heat, a thermistor configured to output a voltage corresponding to a temperature to one end, a first resistor that has one end to which the supply voltage is supplied and another end connected to the one end of the thermistor, a second resistor that has one end to which the supply voltage is supplied, a third resistor that has one end connected to another end of the second resistor and another end that is grounded, a differential amplifier that has one input terminal to which a voltage between the other end of the first resistor and the one end of the thermistor is input and another input terminal to which a voltage between the other end of the second resistor and the one end of the third resistor is input thus amplifying a difference between the voltage input to the one input terminal and the voltage input to the other input terminal so as to output as a control voltage, and a control IC that includes a digital variable resistor connected between the other end of the first resistor and the one end of the thermistor and a controller that adjusts a resistance value of the digital variable resistor based on a digital control signal input from outside. Accordingly, the use of the analog oscillator provides the following effects: providing the proper phase noise characteristic, the accurate and easy adjustment of the temperature control circuit by the digital control with a simple configuration, stabilizing the operation of the temperature control circuit to maintain the turnover temperature of the crystal resonator, and obtaining the output frequency signal with the sufficient property and the high stability.

According to this disclosure, in the above-described oven controlled crystal oscillator, the crystal oscillator includes a reference signal terminal that supplies a reference signal to a crystal resonator, a fifth resistor connected in series between the reference signal terminal and the crystal resonator, a first capacitance element connected in series between the fifth resistor and the crystal resonator, and a second capacitance element that has one end connected between the fifth resistor and the first capacitance element and another end that is grounded. The control IC includes another digital variable resistor connected to a point between the first capacitance element and the second capacitance element. The controller adjusts a resistance value of the other digital variable resistor based on a digital control signal input from outside. Accordingly, the following effects are provided: adjusting the temperature control circuit by the digital control to stabilize the temperature control while adjusting the crystal oscillator by the digital control to accurately and easily adjust the oscillation frequency, thus obtaining the output frequency signal with the sufficient property and the high stability.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An oven controlled crystal oscillator, comprising:
  a crystal oscillator that includes a crystal resonator and an oscillator circuit;
  a temperature control circuit including:
    a heater resistor that has one end to which a supply voltage connects to generate a heat;
    a thermistor configured to output a voltage to one end, the voltage corresponding to a temperature;
    a first resistor that has one end to which the supply voltage is supplied and another end connected to the one end of the thermistor;
    a second resistor that has one end to which the supply voltage is supplied;
    a third resistor that has one end connected to another end of the second resistor and another end of the third resistor is grounded;
    a differential amplifier that has one input terminal and another input terminal, a voltage between the another end of the first resistor and the one end of the thermistor being input to the one input terminal, a voltage between another end of the second resistor and the one end of the third resistor being input to the another input terminal, the differential amplifier amplifying a difference between the voltage input to the one input terminal and the voltage input to the another input terminal so as to output as a control voltage;
    a thermosensor disposed in parallel to the first resistor, the thermosensor having one end to which the supply voltage is supplied; and
    a fourth resistor that has one end connected to another end of the thermosensor and another end of the fourth resistor is grounded; and
  a control integrated circuit that includes a digital variable resistor and a controller, the digital variable resistor being connected to the thermosensor in parallel, the controller adjusting a resistance value of the digital variable resistor based on a digital control signal input from outside.

2. The oven controlled crystal oscillator according to claim 1, wherein
  the crystal oscillator includes:
    a reference signal terminal that supplies a reference signal to the crystal resonator;
    a fifth resistor connected in series between the reference signal terminal and the crystal resonator;
    a first capacitance element connected in series between the fifth resistor and the crystal resonator; and
    a second capacitance element that has one end connected between the fifth resistor and the first capacitance element and another end of the second capacitance element is grounded;
  the control integrated circuit includes another digital variable resistor connected to a point between the first capacitance element and the second capacitance element, and
  the controller adjusts a resistance value of the another digital variable resistor based on a digital control signal input from outside.

3. The oven controlled crystal oscillator according to claim 1, wherein
the crystal oscillator includes:
a reference signal terminal that supplies a reference signal to the crystal resonator;
a fifth resistor connected in series between the reference signal terminal and the crystal resonator;
a first capacitance element connected in series between the fifth resistor and the crystal resonator; and
a second capacitance element that has one end connected between the fifth resistor and the first capacitance element and another end of the second capacitance element is grounded;
the control integrated circuit includes a digital capacitor connected to a point between the first capacitance element and the second capacitance element, and
the controller adjusts a capacitance value of the digital capacitor based on a digital control signal input from outside.

4. An oven controlled crystal oscillator, comprising:
a crystal oscillator that includes a crystal resonator and an oscillator circuit;
a heater resistor that has one end to which a supply voltage connects to generate a heat;
a thermistor configured to output a voltage to one end, the voltage corresponding to a temperature;
a first resistor that has one end to which the supply voltage is supplied and another end connected to the one end of the thermistor;
a second resistor that has one end to which the supply voltage is supplied;
a third resistor that has one end connected to another end of the second resistor and another end of the third resistor is grounded;
a differential amplifier that has one input terminal and another input terminal, a voltage between the another end of the first resistor and the one end of the thermistor being input to the one input terminal, a voltage between the another end of the second resistor and the one end of the third resistor being input to the another input terminal, the differential amplifier amplifying a difference between the voltage input to the one input terminal and the voltage input to the another input terminal so as to output as a control voltage; and
a control integrated circuit that includes a digital variable resistor and a controller, the digital variable resistor being connected between the another end of the first resistor and the one end of the thermistor, the controller adjusting a resistance value of the digital variable resistor based on a digital control signal input from outside.

5. The oven controlled crystal oscillator according to claim 4, wherein
the crystal oscillator includes:
a reference signal terminal that supplies a reference signal to the crystal resonator;
a fifth resistor connected in series between the reference signal terminal and the crystal resonator;
a first capacitance element connected in series between the fifth resistor and the crystal resonator; and
a second capacitance element that has one end connected between the fifth resistor and the first capacitance element and another end of the second capacitance element is grounded;
the control integrated circuit includes another digital variable resistor connected to a point between the first capacitance element and the second capacitance element, and
the controller adjusts a resistance value of the another digital variable resistor based on a digital control signal input from outside.

6. The oven controlled crystal oscillator according to claim 4, wherein
the crystal oscillator includes:
a reference signal terminal that supplies a reference signal to the crystal resonator;
a fifth resistor connected in series between the reference signal terminal and the crystal resonator;
a first capacitance element connected in series between the fifth resistor and the crystal resonator; and
a second capacitance element that has one end connected between the fifth resistor and the first capacitance element and another end of the second capacitance element is grounded;
the control integrated circuit includes a digital capacitor connected to a point between the first capacitance element and the second capacitance element, and
the controller adjusts a capacitance value of the digital capacitor based on a digital control signal input from outside.

* * * * *